US006616514B1

(12) United States Patent
Edelbach et al.

(10) Patent No.: US 6,616,514 B1
(45) Date of Patent: Sep. 9, 2003

(54) HIGH SELECTIVITY CMP SLURRY

(75) Inventors: Brian Edelbach, Lima, NY (US); Eric Oswald, Rochester, NY (US); Yie-Shein Her, Canandaigua, NY (US)

(73) Assignee: Ferro Corporation, Cleveland, OH (US)

( * ) Notice: Subject to any disclaimer, the term of this patent is extended or adjusted under 35 U.S.C. 154(b) by 0 days.

(21) Appl. No.: 10/161,315

(22) Filed: Jun. 3, 2002

(51) Int. Cl.⁷ .................................................. B24B 1/00
(52) U.S. Cl. ........................... 451/60; 451/36; 451/446; 451/41; 438/690; 438/691; 438/692; 438/693; 252/79.1; 252/79.2; 252/79.4; 252/79.5; 216/89; 216/90; 216/99
(58) Field of Search ............................. 451/36, 41, 60, 451/446; 438/690, 691, 692, 693; 252/79.1, 79.2, 79.4, 79.5; 216/89, 90, 99

(56) References Cited

U.S. PATENT DOCUMENTS

| 5,738,800 A | 4/1998 | Hosali et al. |
| 5,759,917 A | 6/1998 | Grover et al. |
| 5,770,103 A * | 6/1998 | Wang et al. ................ 252/79.1 |

FOREIGN PATENT DOCUMENTS

| EP | 0786504 A2 | 7/1997 |
| EP | 0846740 A1 | 6/1998 |
| EP | 0853335 A2 | 7/1998 |
| WO | WO 01/32794 A1 | 5/2001 |

OTHER PUBLICATIONS

Laparra et al., "A High Oxide:Nitride Selectivity CMP Slurry For Shallow Trench Isolation," Electrochemical Society Proceedings vol. 98–7, pp. 218–234.

Jin et al., "A Production–Proven Shallow Trench Isolation (STI) Solution Using Novel CMP Concepts" Feb. 11, 1999 CMP–MIC Conference, '99 IMIC 400P/99/0314, pp. 314–321.

Withers et al., "A Wide Margin CMP And Clean Process For Shallow Trench Isolation Applications," Feb. 19, 1998 CMP–MIC Conf., '98 IMIC 300P/98/0319, pp. 319–325.

Choi et al., "Application Of Ceria–Based High Selectivity Slurry To STI CMP For Sub 0.18 . . . ," Feb. 11, 1999 CMP–MIC Conf., '99 IMIC 400P/99/0307, pp. 307–313.

* cited by examiner

Primary Examiner—Joseph J. Hail, III
Assistant Examiner—Shantese McDonald
(74) Attorney, Agent, or Firm—Rankin, Hill, Porter & Clark LLP

(57) ABSTRACT

The present invention provides a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium. In the preferred embodiment, ceria particles are used as the abrasive and the organic polyol is selected from the group consisting of mannitol, sorbitol, mannose, xylitol, sorbose, sucrose, and dextrin. The chemical mechanical polishing slurry can further optionally include acids or bases for adjusting the pH within an effective range of from about 2 to about 12. The present invention also provides a method of selectively removing a first substance such as silicon dioxide in preference to silicon nitride from a surface of an article by chemical-mechanical polishing.

20 Claims, No Drawings

HIGH SELECTIVITY CMP SLURRY

FIELD OF THE INVENTION

The present invention provides a chemical mechanical polishing slurry and, more particularly, a chemical mechanical polishing slurry that exhibits a high selectivity for silicon dioxide in preference to silicon nitride over a broad pH range.

BACKGROUND OF THE INVENTION

Hosali et al., U.S. Pat. No. 5,738,800, disclose a slurry for chemical mechanical polishing (CMP) a composite comprised of silicon dioxide and silicon nitride. The CMP slurry according to Hosali et al. comprises an aqueous medium, abrasive particles, a surfactant, and a complexing agent having two or more functional groups each having a dissociable proton that complexes with the silicon dioxide and silicon nitride. The surfactant used in conjunction with the complexing agent in the CMP slurry according to Hosali et al. does not perform the usual function of surfactants (i.e., the stabilization of the particulate dispersion), but rather it is believed by the inventors to affect the rate of removal of silicon nitride from the composite surface. The chemistry of the interaction between the surfactant and the complexing agent is not explained. The composition according to Hosali et al. exhibits selectivity better than conventional CMP slurries, but only within a narrow range of pH (from about 6 to about 7).

Grover et al., U.S. Pat. No. 5,759,917, disclose a CMP slurry for selectively polishing a silicon dioxide overfill in preference to a silicon nitride film stop layer during the manufacture of integrated circuit's and semiconductors. The CMP slurry according to Grover et al. comprises a carboxylic acid, a salt, and a soluble cerium compound at a pH within the range of from about 3 to about 11. The specification of Grover et al. states that a silicon dioxide to silicon nitride removal selectivity of from about 5 to about 100 is obtainable, but the highest reported selectivity in any of the examples in Grover is 34.89, and the substantial majority of the examples yield a selectivity of less than 20.

Kodama et al, EP 0 786 504 A2, disclose a CMP polishing composition comprising silicon nitride particles, water, and an acid. The CMP polishing composition according to Kodama et al. is said to exhibit high selectivity for polishing silicon dioxide relative to silicon nitride. The highest selectivity reported in any of the examples in Kodama et al. is 32.5, and the substantial majority of the examples yield a selectivity of less than 20.

Ronay, EP 0 846 740 A1, discloses a CMP slurry for shallow trench isolation (STI) processing that contains abrasive particles and a polyelectrolyte having a molecular weight of between about 500 and 10,000 such as, for example, polyethylenimine. The pH of the slurry must be kept between 9 to 11, and there is no information provided regarding whether the CMP slurry according to Ronay provides any degree of selectivity between silicon dioxide and silicon nitride.

Morrison et al., EP 0 853 335 A2, disclose a CMP slurry for STI processing that comprises a mixture of a conventional CMP slurry (typically colloidal silica suspended in an aqueous medium) to which has been added tetramethyl ammonium hydroxide and hydrogen peroxide. The modified CMP slurry according to Morrison et al. is said to improve the typical silicon dioxide to silicon nitride selectivity of 4 to as high as 30. The pH of the slurry must be maintained within a rather narrow range of from about 11 to 12.9.

Several literature references also discuss CMP slurries for use in STI processing. For example, *A High Oxide:Nitride Selectivity CMP Slurry for Shallow Trench Isolation*, by Sharath Hosali and Ray Lavoie, in Electromechanical Society Proceedings Volume 98–7 (1998), pages 218–234, discloses a slurry that is said to enhance the selectivity rate between silicon oxide and silicon nitride removal by CMP processes. The slurry disclosed in that reference includes cerium oxide as an abrasive with an undisclosed proprietary solution that inhibits the removal rate of the silicon nitride. This references reports that a high rate of selectivity can be obtained for unpatterned silicon wafers. However, the selectivity reported for the slurry on a patterned silicon wafer was almost the same as with the conventional CMP slurry it was compared against.

Another literature reference, *Application of Ceria-based High Selectivity Slurry to STI CMP For Sub 0.18 µm CMOS Technologies*, by Ki-Sik Choi, Sang-Ick Lee, Chang-II Kim, Chul-Woo Nam, Sam-Dong Kim, and Chung-Tae Kim, CMP-MIC Conference, Feb. 11–12, 1999, pages 307–313, discloses the use of a ceria-based CMP slurry in the process of forming an STI structure, but no specific information is provided regarding how to prepare the slurry. This reference teaches that dummy patterns are required in order to minimize a phenomena known as dishing, which is the formation of shallow depressions in the silicon dioxide filled trenches below the plane of the top surface of silicon nitride stop layer during CMP processing. This reference also reported that there were some problems related to scratches being formed by the ceria abrasive which required filtering to correct.

Yet another literature reference, *A Production-Proven Shallow Trench Isolation (STI) Solution Using Novel CMP Concepts*, by Raymond R. Jin, Jeffery David, Bob Abbassi, Tom Osterheld, and Fritz Redeker, CMP-MIC Conference on Feb. 11–12, 1999, pages 314–321, discusses the problem of having to use dummy patterns to reduce dishing. The solution offered is to employ a low selectivity, or no selectivity, CMP slurry for minimizing dishing during CMP processing in combination with a special system, apparatus, and polishing heads.

Finally, yet another literature reference, *A Wide Margin CMP and Clean Process For Shallow Trench Isolation Applications*, by Brad Withers, Eugen Zhoa, Rahul Jairath, CMP-MIC Conference on Feb. 19–20, 1998, pages 319–327, addresses the problems of process cost and complexity due to the need for block masks, pattern resist etch, high selectivity material overlays or implementation of dummy active areas. No solutions for these problems are provided.

It should be readily apparent from the foregoing that there remains a need within the art for a method of chemical mechanical polishing and a slurry that exhibits high selectivity for silicon dioxide in preference to silicon nitride and that has a wide working range of pH.

SUMMARY OF THE INVENTION

The present invention provides a chemical mechanical polishing slurry that is effective over a wide range of pH for selectively removing silicon dioxide in preference to silicon nitride from a surface of an article by chemical mechanical polishing. The aqueous slurry according to the present invention comprises an abrasive, an aqueous medium, and an organic polyol that does not dissociate protons, said organic polyol comprising a compound having at least three hydroxyl groups that are not dissociable in the aqueous medium, or a polymer formed from at least one monomer having at least three hydroxyl groups that are not dissociable in the aqueous medium. In a preferred embodiment, the abrasive comprises ceria particles and the organic polyol comprises one or more selected from the group consisting of mannitol, sorbitol, mannose, xylitol, sorbose, sucrose, and dextrin. The aqueous slurry according to the invention can optionally include acids or bases for adjusting the pH within an effective range of from about 2 to about 12.

The present invention also provides a method of selectively removing a first substance such as silicon dioxide in preference to silicon nitride from a surface of an article by chemical-mechanical polishing. The method of the present invention comprises polishing a surface of an article using a polishing pad, an abrasive, an aqueous medium, and an organic polyol that does not dissociate protons, said organic polyol comprising a compound having at least three hydroxyl groups that are not dissociable in the aqueous medium, or a polymer formed from at least one monomer having at least three hydroxyl groups that are not dissociable in the aqueous medium. The abrasive preferably comprises particles that are dispersed in the aqueous medium. However, it is also possible for the abrasive to be bonded to the polishing pad.

The chemical mechanical polishing slurry and method of the present invention are particularly useful in applications such as, for example, the fabrication of shallow trench isolation (STI) devices, deep trench isolation (DTI) devices, and copper damascene structures, where control over the silicon dioxide to silicon nitride polishing rate selectivity is critical. The organic polyol present in the slurry functions to suppress the rate of silicon nitride removal without significantly reducing the rate of silicon dioxide removal. The removal rate of silicon nitride can be controlled by varying the concentration of the organic polyol in the slurry, whereas the removal rate of silicon dioxide can be regulated by changing other CMP conditions, such as abrasive concentration and size, polishing pad down force, pH, and/or speed. The compounds used in the aqueous slurry and method according to the present invention are environmentally benign, and thus present minimal considerations in terms of waste water treatment and disposal.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DETAILED DESCRIPTION OF THE PREFERRED EMBODIMENTS

The chemical mechanical polishing slurry according to the invention comprises an abrasive, an aqueous medium, and an organic polyol that does not dissociate protons, said organic polyol comprising a compound having at least three hydroxyl groups that are not dissociable in the aqueous medium or a polymer formed from at least one monomer having at least three hydroxyl groups that are not dissociable in the aqueous medium. The slurry is particularly useful for removing a first substance such as silicon dioxide, silicon-containing spin-on-glass, silicon-containing ceramics, silicon-containing low-k materials, low-k dielectric resins, copper, tungsten, aluminum, tantalum, tantalum nitride, titanium, titanium nitride, and combinations of two or more of the foregoing (hereinafter sometimes collectively referred to as "first substances"), for example, from a surface of an article in preference to silicon nitride by chemical mechanical polishing.

The abrasive performs a mechanical grinding function. Preferably, the abrasive comprises discrete particles that are dispersed in the aqueous medium. It will be appreciated, however, that the abrasive can also be bonded to a polishing pad.

The abrasive can comprise any one or a mixture of abrasives that are conventionally utilized in chemical mechanical polishing slurries. Examples of suitable abrasives include alumina, ceria, copper oxide, iron oxide, nickel oxide, manganese oxide, silica, silicon nitride, silicon carbide, tin oxide, titania, titanium carbide, tungsten oxide, yttrium oxide, and/or zirconia. Ceria is the presently most preferred abrasive for use in the invention.

The particle size of the abrasive used in the chemical mechanical polishing slurry according to the invention is not per se critical. However, if the abrasive particles are too small, the removal rate (also sometimes referred to herein as the "polishing rate") of the slurry can be unacceptably low. On the other hand, if the abrasive particles are too large, unacceptable scratching can occur on the surface of the article being polished. To obtain high removal rates and low scratching and other surface defects, abrasive particles having a mean average diameter of from about 0.02 $\mu$m to about 1.0 $\mu$m, with a maximum size of less than about 10 $\mu$m, are preferred. Particles having an average diameter of from about 0.1 $\mu$m to about 0.5 $\mu$m are most preferred.

The abrasive particles can be present in the slurry in an amount of from about 0.1% to about 60% by weight of the slurry, with the optimal range being from about 0.5% to about 10% by weight of the slurry. Small amounts of conventional surfactancts and/or dispersants can be used to assist in dispersing the abrasive in the aqueous medium.

The aqueous medium preferably comprises deionized, distilled water. Solvents and rheology adjusters can also be present, but are generally not necessary.

The organic polyol performs the function of suppressing the rate of removal of silicon nitride during chemical mechanical polishing. The organic polyol may comprise any one or a mixture of a variety of polyols that do not dissociate protons. However, the organic polyol must comprise a compound having at least three hydroxyl groups that are not dissociable in the aqueous medium, or a polymer formed from at least one monomer having at least three hydroxyl groups that are not dissociable in the aqueous medium. The preferred organic polyols for use in the invention include mannitol, sorbitol, mannose, xylitol, sorbose, sucrose, and dextrin, with mannitol being presently most preferred.

The organic polyol is preferably present in the slurry in an amount of from about 0.1 to about 20% by weight, with the optimal range being from about 0.5% to about 10% by weight of the slurry. As the concentration of the organic polyol in the slurry increases, the removal rate of silicon nitride decreases. This is also true with respect to the removal rate of silicon dioxide and other first substances, but to a much lesser extent.

The chemical mechanical polishing slurry according to the present invention exhibits a high silicon dioxide to silicon nitride removal selectivity over broad range of pH, from as low as about 2 to as high as about 12. Preferably, the pH of the slurry is within the range of from about 4 to about 10. The pH of the slurry can be adjusted by the addition of one or more acids or bases, as needed. Nitric acid is the presently preferred acid for lowering the pH of the slurry, and potassium hydroxide, ammonium hydroxide, and organic amines such as ethanol amine are preferred bases for increasing the pH of the slurry. It will be appreciated that the selection of a pH adjuster is not critical, and that other acids, such as hydrochloric acid for example, and other bases, such as sodium hydroxide for example, can be used. The slurry may also optionally comprise surfactants, pH buffers, and anti-foaming agents, which are well known in the art.

The silicon dioxide to silicon nitride selectivity of the slurry can be adjusted from as low as about 10 to as high as about 500 or more. Selectivity is typically adjusted by varying the amount of the organic polyol in the slurry. For some applications, such as the planarization of STI structures using a slurry comprising abrasive particles, a silicon dioxide to silicon nitride selectivity of about 40 to about 60 is preferred. If the abrasive particles are bonded to the polishing pad, then a much higher selectivity may be desired because the problem of "dishing" is minimized due to the inherent properties of the polishing pad.

The chemical mechanical polishing slurry according to the present invention may be prepared by dispersing the abrasive particles in an aqueous medium either before or after the organic polyol has been added. The slurry may also be prepared as a two-component system (i.e., a first component comprising an abrasive dispersed in an aqueous medium and a second component comprising an organic polyol dispersed in an aqueous medium). The slurry may also be prepared in concentrated form needing only the addition of deionized water to dilute the concentrate (or concentrated components in a two-component system) to the desired level.

Alternatively, the chemical mechanical polishing slurry according to the present invention may be formed by incorporating a portion of the components of the slurry in a polishing pad. For example, the abrasive and the organic polyol could be incorporated directly in the polishing pad, and deionized water could then be added to the pad or the surface of the article being polished to form the slurry in situ. In another alternative embodiment, the abrasive could be bonded to the polishing pad, and the organic polyol and deionized water could be added either separately or together to the pad or the surface of the article being polished to form the polishing slurry in situ. It will be appreciated that the components of the slurry according to the invention could be combined in various ways to form the slurry in situ.

The present invention also provides a method of removing a first substance in preference to silicon nitride from a surface of an article by chemical mechanical polishing. The method according to the invention comprises contacting the surface with a polishing pad, an abrasive, an aqueous medium, and an organic polyol that does not dissociate protons, said organic polyol comprising a compound having at least three hydroxyl groups that are not dissociable in the aqueous medium, or a polymer formed from at least one monomer having at least three hydroxyl groups that are not dissociable in the aqueous medium. It will be appreciated that the abrasive particles need not necessarily be present as free particles in a slurry, but rather they can be fixedly bonded to the polishing pad.

The following examples are intended only to illustrate the invention and should not be construed as imposing limitations upon the claims.

EXAMPLE 1

CMP Slurries A through G were prepared by dispersing 1.0% by weight ceria particles having a mean diameter of 0.17 μm in deionized distilled water. No organic polyol was added to CMP Slurry A, which is a control. For CMP Slurries B through G, 2.0% by weight of an organic polyol as shown in Table 1 below was added to the slurry. The pH of all slurries was then adjusted to 9.5 by the addition of a sufficient quantity of mono ethanol amine. CMP Slurries A through G were each separately used to chemically mechanically polish an LPCVD TEOS silicon dioxide film on an 8" diameter silicon substrate and an LPCVD silicon nitride film on an 8" diameter silicon substrate. Polishing was carried out in each case using a Strasbaugh 6EC polisher at 3.3 psi down pressure, 1.2 psi back pressure, 70 rpm table speed, and a 65 rpm quill speed. The polishing pad was a Rodel IC1000 pad with a Suba IV subpad. The slurry flow rate was 150 ml/min. The removal rates for each of the slurries is reported in Table 1 below:

TABLE 1

| Slurry | Organic Polyol | $SiO_2$ Removal Rate | $Si_3N_4$ Removal Rate | $SiO_2:Si_3N_4$ Selectivity |
|---|---|---|---|---|
| A | none | 3548 Å/min | 499 Å/min | 7 |
| B | mannitol | 2889 Å/min | 12 Å/min | 241 |
| C | sorbitol | 3400 Å/min | 11 Å/min | 309 |
| D | mannose | 3221 Å/min | 14 Å/min | 230 |
| E | xylitol | 3135 Å/min | 13 Å/min | 241 |
| F | sorbose | 3121 Å/min | 10 Å/min | 312 |
| G | dextrin | 2736 Å/min | 93 Å/min | 29 |

Example 1 demonstrates that the removal rate of silicon nitride is significantly suppressed by the presence of an organic polyol in a CMP slurry.

EXAMPLE 2

CMP Slurries H and J were prepared by dispersing 2.0% by weight ceria particles having a mean diameter of 0.17 μm in deionized distilled water. For CMP Slurry J only, 1.0% by weight of mannitol was added to the slurry. The pH of both slurries was then adjusted to 4.0 by the addition of a sufficient quantity of nitric acid. CMP Slurries H and J were each separately used to chemically mechanically polish an LPCVD TEOS silicon dioxide film on an 8" diameter silicon substrate and an LPCVD silicon nitride film on an 8" diameter silicon substrate. Polishing was carried out in each case using a Strasbaugh 6EC polisher at 7.0 psi down pressure, 3.0 psi back pressure, 70 rpm table speed, and a 65 rpm quill speed. The polishing pad was a Rodel IC1000 pad with a Suba IV subpad. The slurry flow rate was 150 ml/min. The polishing rates for each of the slurries is reported in Table 2 below:

TABLE 2

| Slurry | Organic Polyol | $SiO_2$ Removal Rate | $Si_3N_4$ Removal Rate | $SiO_2:Si_3N_4$ Selectivity |
|---|---|---|---|---|
| H | None | 5807 Å/min | 1671 Å/min | 3 |
| J | mannitol (2.0%) | 4233 Å/min | 53 Å/min | 80 |

Example 2 demonstrates that an organic polyol is also effective in suppressing the removal rate of silicon nitride in the acidic pH range.

EXAMPLE 3

CMP Slurries K and L were prepared by dispersing 1.0% by weight ceria particles having a mean diameter of 0.17 μm in deionized distilled water. For CMP Slurry K, 4.0% by weight of mannitol was added to the slurry. For CMP Slurry L, 6.0% by weight of mannitol was added to the slurry. The pH of both slurries was then adjusted to 4.0 by the addition of a sufficient quantity of nitric acid. CMP Slurries K and L were each separately used to chemically mechanically polish an LPCVD TEOS silicon dioxide film on an 8" diameter silicon substrate and an LPCVD silicon nitride film on an 8" diameter silicon substrate. Polishing was carried out in each case using a Strasbaugh 6EC polisher at 7.0 psi down pressure, 3.0 psi back pressure, 60 rpm table speed, and a 60 rpm quill speed. The polishing pad was a Rodel IC1000 pad with a Suba IV subpad. The slurry flow rate was 150 ml/min. The removal rates for each of the slurries is reported in Table 3 below:

TABLE 3

| Slurry | Organic Polyol | $SiO_2$ Removal Rate | $Si_3N_4$ Removal Rate | $SiO_2:Si_3N_4$ Selectivity |
|---|---|---|---|---|
| H | mannitol (4.0%) | 2470 Å/min | 32 Å/min | 77 |
| J | mannitol (6.0%) | 1226 Å/min | 12 Å/min | 102 |

Example 3 demonstrates that the removal rate of $Si_3N_4$ decreases (i.e., is suppressed) as the concentration of an organic polyol in the CMP slurry increases.

Additional advantages and modifications will readily occur to those skilled in the art. Therefore, the invention in its broader aspects is not limited to the specific details and illustrative examples shown and described herein. Accordingly, various modifications may be made without departing from the spirit or scope of the general inventive concept as defined by the appended claims and their equivalents.

What is claimed:

1. A chemical mechanical polishing slurry comprising:
   an abrasive;
   an aqueous medium; and
   an organic polyol that does not dissociate protons, said organic polyol comprising:
     a compound having at least three hydroxyl groups that are not dissociable in the aqueous medium; or
     a polymer formed from at least one monomer having at least three hydroxyl groups that are not dissociable in the aqueous medium.

2. The chemical mechanical polishing slurry according to claim 1 wherein the organic polyol comprises one or more selected from the group consisting of mannitol, sorbitol, mannose, xylitol, sorbose, sucrose, and dextrin.

3. The chemical mechanical polishing slurry according to claim 1 wherein the abrasive comprises particles of one or more selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, and zirconia.

4. The chemical mechanical polishing slurry according to claim 1 further comprising an acid or a base for adjusting the pH of the slurry within the range of from about 2 to about 12.

5. The chemical mechanical polishing slurry according to claim 4 wherein the acid comprises nitric acid.

6. The chemical mechanical polishing slurry according to claim 4 wherein the base comprises one or more selected from the group consisting of KOH, $NH_4OH$, and organic amines.

7. The chemical mechanical polishing slurry according to claim 6 wherein the organic amine comprises ethanol amine.

8. The chemical mechanical polishing slurry according to claim 1 wherein the abrasive comprises ceria particles, the organic polyol comprises mannitol, and the slurry further comprises an acid or a base to adjust the pH within the range of from about 4 to about 10.

9. The chemical mechanical polishing slurry according to claim 1 wherein the abrasive is bonded to a polishing pad.

10. The chemical mechanical polishing slurry according to claim 1 for use in removing a first substance from a surface of an article in preference to silicon nitride by chemical mechanical polishing.

11. The chemical mechanical polishing slurry according to claim 10 wherein the first substance comprises one or more selected from the group consisting of silicon dioxide, silicon-containing spin-on-glass, silicon-containing ceramics, silicon-containing low-k materials, low-k dielectric resins, copper, tungsten, aluminum, tantalum, tantalum nitride, titanium, titanium nitride, and combinations of two or more of the foregoing.

12. A method of removing a first substance in preference to silicon nitride from a surface of an article by chemical mechanical polishing comprising contacting the surface with a polishing pad, an abrasive, an aqueous medium, and an organic polyol that does not dissociate protons, said organic polyol comprising a compound having at least three hydroxyl groups that are not dissociable in the aqueous medium, or a polymer formed from at least one monomer having at least three hydroxyl groups that are not dissociable in the aqueous medium.

13. The method according to claim 12 wherein the abrasive comprises particles that are dispersed in the aqueous medium.

14. The method according to claim 12 wherein the abrasive is bonded to the polishing pad.

15. The method according to claim 12 wherein the organic polyol comprises one or more selected from the group consisting of mannitol, sorbitol, mannose, xylitol, sorbose, sucrose, and dextrin.

16. The method according to claim 12 wherein the abrasive comprises one or more selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, and zirconia.

17. The method according to claim 12 wherein the abrasive comprises ceria particles, the organic polyol comprises mannitol, and the aqueous medium further comprises an acid or a base to adjust the pH within the range of from about 2 to about 12.

18. The method according to claim 12 wherein the first substance comprises one or more selected from the group consisting of silicon dioxide, silicon-containing spin-on-glass, silicon-containing ceramics, silicon-containing low-k materials, low-k dielectric resins, copper, tungsten, aluminum, tantalum, tantalum nitride, titanium, titanium nitride, and combinations of two or more of the foregoing.

19. The method according to claim 12 wherein the article is a shallow trench isolation (STI) device, a deep trench isolation (DTI) device, or a copper damascene structure.

20. A chemical mechanical polishing slurry for use in removing a first substance from a surface of an article in preference to silicon nitride by chemical mechanical polishing, the slurry comprising:
   from about 0.5% to about 10% by weight of an abrasive comprising particles of one or more selected from the group consisting of alumina, ceria, copper oxide, iron oxide, nickel oxide, manganese oxide, silica, silicon nitride, silicon carbide, tin oxide, titania, titanium carbide, tungsten oxide, yttrium oxide, and zirconia, the particles having an average mean diameter of from about 0.1 μm to about 0.5 μm;

an aqueous medium;

from about 0.1% to about 10% by weight of an organic polyol that does not dissociate protons, said organic polyol comprising a compound having at least three hydroxyl groups that are not dissociable in the aqueous medium selected from the group consisting of mannitol, sorbitol, mannose, xylitol, sorbose, sucrose, and dextrin; and an acid or a base for adjusting the pH of the slurry within the range of from about 4 to about 10; and wherein the first substance comprises one or more selected from the group consisting of silicon dioxide, silicon-containing spin-on-glass, silicon-containing ceramics, silicon-containing low-k materials, low-k dielectric resins, copper, tungsten, aluminum, tantalum, tantalum nitride, titanium, titanium nitride, and combinations of two or more of the foregoing.

* * * * *